United States Patent
He et al.

(10) Patent No.: US 11,549,057 B2
(45) Date of Patent: Jan. 10, 2023

(54) QUANTUM DOT LUMINESCENT MATERIAL AN METHOD OF PRODUCING THEREOF

(71) Applicant: Shenzhen CHINA STAR OPTOELECTRONICS SEMICONDUCTOR DISPLAY TECHNOLOGY CO., LTD., Guangdong (CN)

(72) Inventors: Bo He, Guangdong (CN); Yongwei Wu, Guangdong (CN); Pei Jiang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 480 days.

(21) Appl. No.: 16/624,550

(22) PCT Filed: Oct. 23, 2019

(86) PCT No.: PCT/CN2019/112644
§ 371 (c)(1),
(2) Date: Dec. 19, 2019

(87) PCT Pub. No.: WO2020/258613
PCT Pub. Date: Dec. 30, 2020

(65) Prior Publication Data
US 2021/0403806 A1    Dec. 30, 2021

(30) Foreign Application Priority Data
Jun. 26, 2019   (CN) .......................... 201910562782.0

(51) Int. Cl.
*C09K 11/66*   (2006.01)
*C09K 11/02*   (2006.01)
(Continued)

(52) U.S. Cl.
CPC .......... *C09K 11/665* (2013.01); *C01G 21/006* (2013.01); *C09K 11/025* (2013.01);
(Continued)

(58) Field of Classification Search
CPC .............. H01L 51/502; H01L 51/5056; H01L 51/5088; H01L 51/5012; H01L 51/001;
(Continued)

(56) References Cited

U.S. PATENT DOCUMENTS

2016/0233447 A1    8/2016   Kim

FOREIGN PATENT DOCUMENTS

| CN | 106450021 A | 2/2017 |
| CN | 106784202 A | 5/2017 |

(Continued)

OTHER PUBLICATIONS

Machine translation of CN 107204401 A, Sep. 26, 17, 9 pages. (Year: 2017).*

(Continued)

*Primary Examiner* — Matthew E. Hoban
*Assistant Examiner* — Lynne Edmondson
(74) *Attorney, Agent, or Firm* — PV IP PC; Wei Te Chung; Ude Lu

(57) ABSTRACT

A quantum dot luminescent material and a method of producing thereof. The quantum dot luminescent material includes a hole injection layer, a hole transport layer, a quantum dot light emitting layer, an electron transport layer, and an electron injection layer. The quantum dot luminescent layer is located on the hole transport layer, and the quantum dot luminescent layer includes uniformly distributed perovskite nanodots.

6 Claims, 2 Drawing Sheets

(51) Int. Cl.
*H01L 51/50* (2006.01)
*C01G 21/00* (2006.01)
*B82Y 20/00* (2011.01)
*B82Y 40/00* (2011.01)
*H01L 51/52* (2006.01)
*H01L 51/56* (2006.01)

(52) U.S. Cl.
CPC ............... *B82Y 20/00* (2013.01); *B82Y 40/00* (2013.01); *C01P 2002/34* (2013.01); *C01P 2004/64* (2013.01); *C01P 2004/80* (2013.01); *C01P 2006/60* (2013.01); *H01L 51/502* (2013.01); *H01L 51/5088* (2013.01); *H01L 51/52* (2013.01); *H01L 51/56* (2013.01); *H01L 2251/303* (2013.01)

(58) Field of Classification Search
CPC ......... H01L 51/0008; H01L 2251/5369; H01L 2251/558; H01L 2251/5353; C09K 11/025; C09K 11/06; C09K 11/665; C01G 21/006; C01G 53/04; C01P 2002/34; C01P 2004/64
See application file for complete search history.

(56) References Cited

FOREIGN PATENT DOCUMENTS

| | | |
|---|---|---|
| CN | 107058984 A | 8/2017 |
| CN | 107204401 A | 9/2017 |
| CN | 107501269 A | 12/2017 |
| CN | 108192606 A | 6/2018 |
| CN | 108807604 A | 11/2018 |
| CN | 109004091 A | 12/2018 |
| CN | 109354059 A | 2/2019 |
| CN | 110311046 A | 10/2019 |

OTHER PUBLICATIONS

Machine translation of CN 106450021 A, May 22, 17, 26 pages. (Year: 2017).*
Machine translation of CN107501269A, Dec. 22, 17, 12 pages. (Year: 2017).*
Machine translation of CN108807604A, Nov. 13, 18, 15 pages. (Year: 2018).*
Sens Actuators, "Physical Vapor Depositoin", last updated Jan. 7, 22, 9 pages. (Year: 2022).*

* cited by examiner

QUANTUM DOT LUMINESCENT MATERIAL AN METHOD OF PRODUCING THEREOF

CROSS REFERENCE TO RELATED APPLICATION

This application claims the priority of International Application No. PCT/CN2019/112644, filed on 2019 Oct. 23, which claims priority to Chinese Application No. 201910562782.0, filed on 2019 Jun. 26. The entire disclosures of each of the above applications are incorporated herein by reference.

BACKGROUND OF INVENTION

Field of Invention

The present invention relates to the field of electronic display, and in particular, to a quantum dot luminescent material and a method of producing thereof Description of Prior Art To improve display effect of organic light emitting diode (OLED) display panels, in the prior art, quantum dot films are usually added to the display panels. The quantum dot films consist of inorganic nanocrystals capable of efficiently emitting light. Compared with traditional organic phosphors, quantum dots have the advantages of adjustable wavelength, high luminous efficiency, small particle size, high color saturation, low cost, and high stability.

Technical Problems

In the prior art, quantum material layer in a quantum dot film is usually produced by a solution method. This method has the advantages of low production cost and large yield, and is advantageous for mass production. However, in the process of this method n, in order to maintain the stability of the quantum dots in solution, it is necessary to generate an organic ligand on the surface of the quantum dots to counteract the van der Waals attraction between the quantum dots. This organic ligand greatly hinders the transfer of charge between quantum dots, which seriously reduces the mobility of carriers in quantum dot materials and makes them less conductive.

SUMMARY OF INVENTION

The present application provides a quantum dot luminescent material and a method for fabricating the same, which improves carrier mobility in a quantum dot luminescent material.

This application provides a quantum dot luminescent material, comprising:
a hole injection layer comprising uniformly distributed nickel oxide and graphene oxide;
a hole transport layer disposed on the hole injection layer;
a quantum dot light emitting layer disposed on the hole transport layer, wherein the quantum dot light emitting layer comprises uniformly distributed perovskite nanodots;
an electron transport layer disposed on the quantum dot light emitting layer; and
an electron injection layer disposed on the electron transport layer.

Correspondingly, the present application also provides a method of producing a quantum dot luminescent material, comprising:
providing a substrate;
forming a hole injection layer on the substrate, the hole injection layer comprising uniformly distributed nickel oxide and graphene oxide;
forming a hole transport layer on the hole injection layer;
forming a quantum dot luminescent layer on the hole transport layer, the quantum dot luminescent layer comprising uniformly distributed perovskite nanodots;
forming an electron transport layer on the quantum dot light emitting layer; and
forming an electron injection layer on the electron transport layer.

According to one aspect of the application, wherein the substrate is a transparent conductive glass.

According to one aspect of the application, wherein forming the hole injecting layer on the substrate comprises:
configuring a nickel oxide precursor;
adding a graphene oxide suspension to the nickel oxide precursor;
performing ultrasonication to the nickel oxide precursor after adding the graphene oxide suspension to the nickel oxide precursor; and
applying the nickel oxide precursor to the substrate after performing ultrasonication to the nickel oxide precursor.

According to one aspect of the application, wherein configuring the nickel oxide precursor comprises:
dissolving nickel acetate tetrahydrate and ethanolamine in ethylene glycol monomethyl ether to form a mixed solution, wherein a molar ratio of nickel acetate tetrahydrate and ethanolamine is 1:1;
stirring the mixed solution at 65° C. for 2 hours and then standing the mixed solution for 24 hours to obtain the nickel oxide precursor.

According to one aspect of the application, wherein in the step of adding the graphene oxide suspension to the nickel oxide precursor, a mass percentage of graphene in the graphene oxide suspension ranges from 0.4 to 0.6 wt %, a volume ratio of the nickel oxide precursor to the graphene oxide suspension ranges between 1:0.025 and 1:0.1.

According to one aspect of the application, wherein a ultrasonication time is greater than or equal to 20 minutes when the nickel oxide precursor with the graphene oxide suspension added is ultrasonicated.

According to one aspect of the application, wherein material of the hole transport layer comprises diphenylamine.

According to one aspect of the application, wherein material of the quantum dot light emitting layer comprises perovskite.

According to one aspect of the application, wherein forming the electron transport layer comprises:
providing a TPBi material;
evaporating the TPBi material in a vacuum chamber, wherein a pressure of the vacuum chamber is less than or equal to 10-3 Pa;
wherein a thickness of the electron injection layer is less than or equal to 40 nm.

BENEFICIAL EFFECTS

In the present application, graphene oxide is added to a hole injection layer of a quantum dot luminescent material, which effectively improves a mobility of carriers in the quantum dot luminescent material, thereby improving conductivity of the quantum dot luminescent material.

DETAILED DESCRIPTION OF PREFERRED EMBODIMENTS

Figure 1:
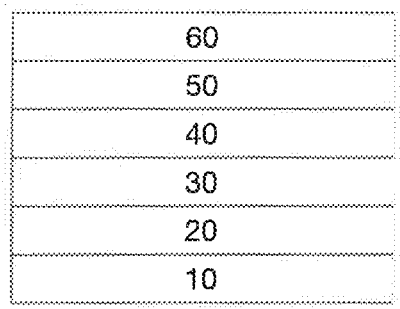
FIG. 1 is a structural diagram of a quantum dot luminescent material in a specific embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present application provides a quantum dot luminescent material and a method for fabricating the same, which improves carrier mobility in a quantum dot luminescent material.

Referring to FIG. 1, FIG. 1 is a schematic structural diagram of a quantum dot luminescent material in a specific embodiment of the present application. The quantum dot luminescent materials are commonly used in organic light emitting diodes. In practice, an organic light emitting diode can be formed by placing a cathode and an anode on opposite surfaces of the quantum dot luminescent film. Because the structure of the organic light emitting diode is a mature technology in the art, in the present embodiment, only the structure of the quantum dot luminescent material will be described.

In this embodiment, the quantum dot luminescent material includes a hole injection layer 20, a hole transport layer 30, a quantum dot luminescent layer, an electron transport layer 50, and an electron injection layer 60.

The hole injection layer 20 includes uniformly distributed nickel oxide (NiOx) and graphene oxide (rGO). Wherein, a mass ratio of the nickel oxide to the graphene oxide is between 1:0.025 and 1:0.1.

The hole transport layer 30 is located on the hole injection layer 20. A material of the hole transport layer 30 includes diphenylamine. In the present embodiment, a TFB material, that is, poly(9,9-dioctylfluorene-CO-N-(4-butylphenyl) is preferably used. Diphenylamine).

The quantum dot luminescent layer 40 is located on the hole transport layer 30, and the quantum dot luminescent layer 40 includes uniformly distributed perovskite nanodots.

The electron transport layer 50 is located on the quantum dot light emitting layer 40. The electron injection layer 60 is located on the electron transport layer 50.

Figure 2:
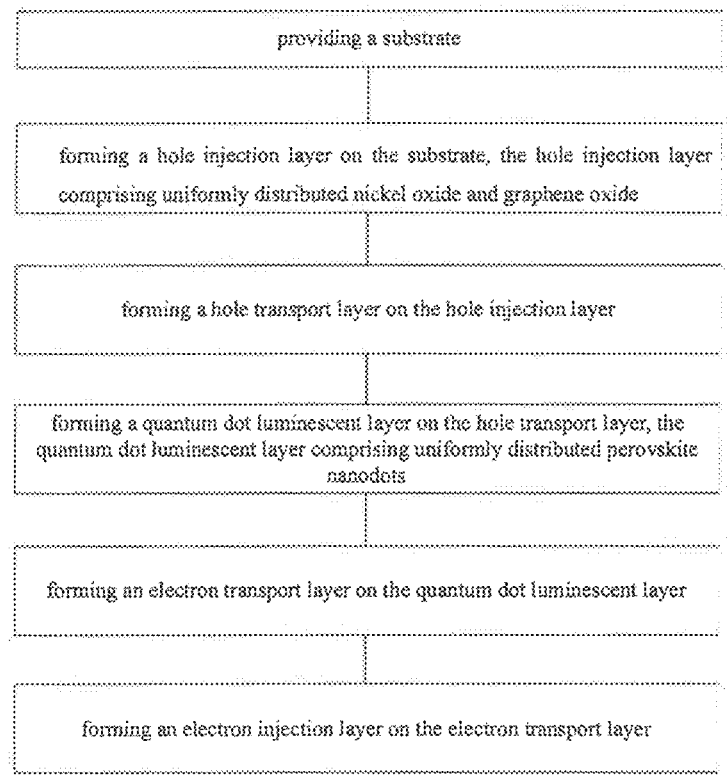
FIG. 2 is a flowchart of a method for producing a quantum dot luminescent material in a specific embodiment of the present application.

The method for producing the quantum dot luminescent material in the present application will be described in detail below with reference to the accompanying drawings. Referring to FIG. 2, FIG. 2 is a flowchart of a method for producing a quantum dot luminescent material according to an embodiment of the present application. The method includes:

providing a substrate 10;

forming a hole injection layer 20 on the substrate 10, the hole injection layer 20 comprising uniformly distributed nickel oxide and graphene oxide;

forming a hole transport layer 30 on the hole injection layer 20;

forming a quantum dot luminescent layer 40 on the hole transport layer 30, the quantum dot luminescent layer 40 comprising uniformly distributed perovskite nanodots;

forming an electron transport layer 50 on the quantum dot luminescent layer 40; and forming an electron injection layer 60 on the electron transport layer 50.

In this embodiment, the substrate 10 is a transparent conductive glass. The substrate 10 is a carrier for producing the quantum dot luminescent material and an anode in an organic light emitting diode. Therefore, the substrate 10 is made of a conductive material. In the present embodiment, in order to enhance the light transmittance, the substrate 10 is made of a transparent conductive material, indium tin oxide (ITO) or fluorine-doped zinc oxide. In other embodiments, the substrate 10 can also be reflective metal.

In this embodiment, the substrate 10 needs to be pretreated. The order of pretreating preprocess is: ultrasonically cleaning the substrate 10 by deionized water, acetone, and alcohol for 15 minutes respectively. Then blow drying the substrate 10 with nitrogen and irradiating the substrate 10 by ultraviolet light for 10 minutes.

In the present embodiment, the method of forming the hole injection layer 20 on the substrate 10 includes the following steps.

First, configuring a nickel oxide precursor. configuring the nickel oxide precursor includes: dissolving nickel acetate tetrahydrate and ethanolamine in ethylene glycol monomethyl ether to form a mixed solution, wherein a molar ratio of nickel acetate tetrahydrate and ethanolamine is 1:1; the concentration of nickel oxide in the mixed solution was 0.2 mol/ml. Then stirring the mixed solution at 65° C. for 2 hours and then standing the mixed solution for 24 hours to obtain the nickel oxide precursor.

Then, adding a graphene oxide suspension to the nickel oxide precursor. A mass percentage of graphene in the graphene oxide suspension ranges from 0.4 to 0.6 wt %, a volume ratio of the nickel oxide precursor to the graphene oxide suspension ranges between 1:0.025 and 1:0.1.

Then nickel oxide precursor with the graphene oxide suspension added is ultrasonicated. In this embodiment, a ultrasonication time is greater than or equal to 20 minutes.

Thereafter, the precursor liquid after ultrasonication is coated onto the substrate 10. In the present embodiment, the method of coating is: placing the substrate 10 after pretreatment in a spin-coating machine, and adding 10 μL of solution per square centimeter at a rotation speed of 2000 rpm for 30 seconds. Then annealing the substrate 10 in air at an annealing temperature of 150° C. for 5 min. In the present embodiment, preferably, the above steps are repeated three times, and annealing the substrate 10at 480°

C. for 2 hours after the third dip coating to obtain the hole injecting layer 20 with sufficiently mixed nickel oxide particles and graphene oxide particles.

In the present embodiment, material forming the hole transport layer 30 is diphenylamine, preferable material is a TFB material, i.e., poly(9,9-dioctylfluorene-CO-N-(4-butylphenyl)diphenylamine). In the present embodiment, a method of forming the hole transport layer 30 includes: dissolving 8 mg of TFB powder in 1 ml of chlorobenzene solution, and then standing the mixed solution until TFB is completely dissolved. Then adding 10 μL of the solution on the hole injection layer 20 per square centimeter at a rotation speed of 3000 rpm for 45 s. Then annealing the hole injection layer 20 in nitrogen for 20 minutes, the temperature was 120° C.

In the present embodiment, material forming the quantum dot luminescent layer 40 is perovskite ($CsPbX_3$, X is a halogen atom). The quantum dot luminescent layer 40 was formed by dissolving 0.4 mol of CsX powder and 0.4 mol of $PbX_2$ in 10 ml of a dimethyl sulfoxide (DMSO) solution, and ultrasonicating at 30 °C. until the powder was completely dissolved. Then adding 0.5 ml of oleic acid and 1 ml of oleylamine to the above solution to produce a precursor solution. Then adding 1 ml of the above precursor liquid to vigorously stirred toluene to produce a quantum dot original solution. The original solution of the quantum dot and ethyl acetate were added to a centrifuge tube at a volume ratio of 1:3, and centrifuged at 8000 rpm for 6-15 minutes. Thereafter, a supernatant was discarded, and a precipitate was redissolved in 0.8 ml of n-hexane. Thereafter, the solution was again centrifuged at 5000 rpm for 3 minutes, a supernatant was taken out and was diluted to 18 mg/ml. Process parameters of spin-on-deposited perovskite quantum dot luminescent layer are: quantum dot solution concentration is 18 mg/ml, solution for per square centimeter is 10 μL, the rotation speed is 2000 rpm, the rotation time is 45 s, and the solvent is volatilized at room temperature under nitrogen protection.

In this embodiment, the method for forming the electron transport layer 50 is: TPBi, that is, 2,2',2"-(1,3,5-Benzinetriyl)-tris (1-phenyl-1-H-benzimidazole) is provided as a material of the electron transport layer 50. Specifically, the TPBi material is vapor-deposited in a vacuum chamber having a pressure of less than or equal to $10^{-3}$ Pa. A thickness of the electron injection layer 60 is less than or equal to 40 nm.

In the present embodiment, after the electron injection layer 60 is formed, a cathode is further formed on the electron injection layer 60. A material forming the cathode includes a metal such as aluminum or silver, or a transparent conductive material such as ITO.

Figure 3:
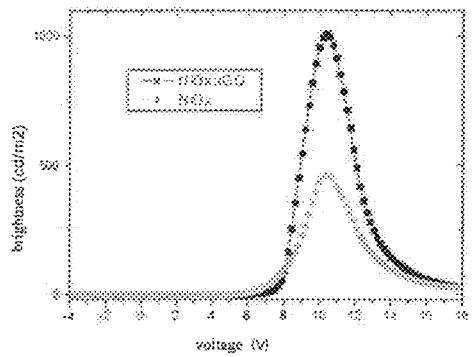
FIG. 3 is a brightness-voltage curve of a quantum dot luminescent material in a specific embodiment of the present application.
Figure 4:
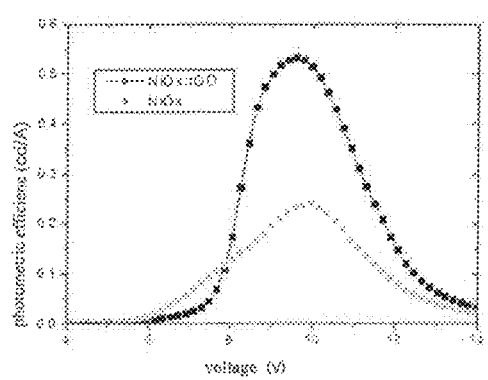
FIG. 4 is a photometric efficiency-voltage curve of a quantum dot luminescent material in a specific embodiment of the present application.
Figure 5:
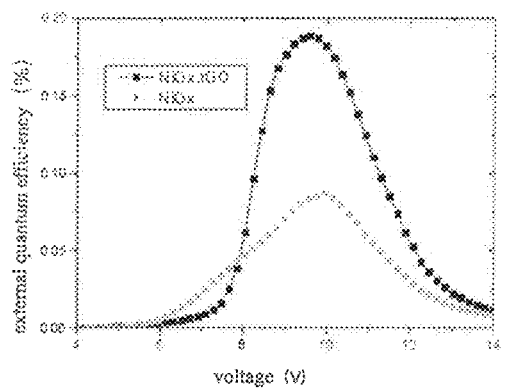
FIG. 5 is an external quantum efficiency-voltage curve of a quantum dot luminescent material in one embodiment of the present application.

Referring to FIG. 3, FIG. 4 and FIG. 5, FIG. 3 is a brightness-voltage curve of a quantum dot luminescent material in a specific embodiment of the present application, FIG. 4 is a photometric efficiency-voltage curve of a quantum dot luminescent material in a specific embodiment of the present application, FIG. 5 is an external quantum efficiency-voltage curve of a quantum dot luminescent material in one embodiment of the present application. It can be seen that after adding graphene oxide to the hole injection layer 20 of the quantum dot luminescent material, the luminance, photometric efficiency and external quantum efficiency of the quantum dot luminescent material are significantly improved compared to the prior art. Therefore, the present application effectively improves a mobility of carriers in the quantum dot luminescent material, thereby improving conductivity of the quantum dot luminescent material.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A method of producing a quantum dot luminescent material, comprising:
   providing a substrate;
   forming a hole injection layer on the substrate, the hole injection layer comprising uniformly distributed nickel oxide and graphene oxide;
   forming a hole transport layer on the hole injection layer;
   forming a quantum dot luminescent layer on the hole transport layer, the quantum dot luminescent layer comprising uniformly distributed perovskite nanodots;
   forming an electron transport layer on the quantum dot luminescent layer; and
   forming an electron injection layer on the electron transport layer;
   wherein forming the hole injecting layer on the substrate comprises:
   configuring a nickel oxide precursor;
   adding a graphene oxide suspension to the nickel oxide precursor;
   performing ultrasonication to the nickel oxide precursor after adding the graphene oxide suspension to the nickel oxide precursor; and
   applying the nickel oxide precursor to the substrate after performing ultrasonication to the nickel oxide precursor;
   wherein configuring the nickel oxide precursor comprises:
   dissolving nickel acetate tetrahydrate and ethanolamine in ethylene glycol monomethyl ether to form a mixed solution, wherein a molar ratio of nickel acetate tetrahydrate and ethanolamine is 1:1
   stirring the mixed solution at 65° C. for 2 hours and then standing the mixed solution for 24 hours to obtain the nickel oxide precursor;
   wherein in the step of adding the graphene oxide suspension to the nickel oxide precursor, a mass percentage of graphene in the graphene oxide suspension ranges from 0.4 to 0.6 wt %, a volume ratio of the nickel oxide precursor to the graphene oxide suspension ranges between 1:0.025 and 1:0.1.

2. The method of producing the quantum dot luminescent material according to claim 1, wherein the substrate is a transparent conductive glass.

3. The method of producing the quantum dot luminescent material according to claim 1, wherein a ultrasonication time is greater than or equal to 20 minutes when the nickel oxide precursor with the graphene oxide suspension added is ultrasonicated.

4. The method of producing the quantum dot luminescent material according to claim 1, wherein material of the hole transport layer comprises diphenylamine.

5. The method of producing the quantum dot luminescent material according to claim 1, wherein material of the quantum dot light emitting layer comprises perovskite.

6. The method of producing the quantum dot luminescent material according to claim 1, wherein forming the electron transport layer comprises:
   providing a TPBi material;
   evaporating the TPBi material in a vacuum chamber, wherein a pressure of the vacuum chamber is less than or equal to $10^{-3}$ Pa;
   wherein a thickness of the electron injection layer is less than or equal to 40 nm.

* * * * *